United States Patent [19]

Chen et al.

[11] Patent Number: 4,612,500
[45] Date of Patent: Sep. 16, 1986

[54] TEMPERATURE STABILIZED FARADAY ROTATOR CURRENT SENSOR BY THERMAL MECHANICAL MEANS

[75] Inventors: Cheng-lin Chen, Penn Hills; Juris A. Asars, Murrysville, both of Pa.; Eugene G. Vaerewyck, Albuquerque, N. Mex.

[73] Assignee: Westinghouse Electric Corp., Pittsburgh, Pa.

[21] Appl. No.: 647,201

[22] Filed: Sep. 4, 1984

[51] Int. Cl.[4] .......................... G01R 15/07; G02F 1/09
[52] U.S. Cl. ...................................... 324/96; 324/105; 350/376; 350/378; 356/368
[58] Field of Search .................. 324/96, 105; 356/368; 350/374, 375, 376, 378

[56] References Cited

U.S. PATENT DOCUMENTS

| | | | |
|---|---|---|---|
| 3,784,281 | 3/1973 | Kuse | 350/377 X |
| 4,563,639 | 1/1986 | Langeac | 324/96 |
| 4,564,754 | 1/1986 | Sato et al. | 324/96 X |

FOREIGN PATENT DOCUMENTS 562453  5/1975  Switzerland .................. 350/377

OTHER PUBLICATIONS

Erickson, D., "The Use of Fiber Optics for Communications, Measurement and Control with High Voltage Substations", IEEE Trans., vol. PAS-99, No. 3, May 1980.

Primary Examiner—Reinhard J. Eisenzopf
Assistant Examiner—Stephen M. Baker
Attorney, Agent, or Firm—L. P. Johns

[57] ABSTRACT

Apparatus for measuring current in a conductor characterized by a magneto-optical current sensor employing the Faraday effect to measure current in a high voltage transmission line. Polarized light having a predetermined plane of polarization is directed into the sensor which plane of polarization is rotated by magnetic field lines generated by the current in the conductor. A bimetal coil rotates the sensor to achieve temperature stability of the current signal in the temperature range of −40° C. to 140° C.

6 Claims, 8 Drawing Figures

TEMPERATURE STABILIZED FARADAY ROTATOR CURRENT SENSOR BY THERMAL MECHANICAL MEANS

CROSS-REFERENCE TO RELATED APPLICATIONS

This application is related to applications filed concurrently herewith including Ser. No. 647,203 filed Sept. 9, 1984, entitled Faraday Current Sensor With Fiber Optic Compensated by Temperature, Degradation and Linearity; and Ser. No. 647,202 filed Sept. 9, 1984, entitled Temperature Compensated Current Sensor Involving Faraday Effect and Fiber Optics, now abandoned, both of which the inventors are C. L. Chen, J. A. Asars, and E. G. Vaerewyck, assigned to the assignee of the instant application.

BACKGROUND OF THE INVENTION

1. Field of the Invention

This invention relates to magneto-optical current sensors that utilize the Faraday rotation effect and, more particularly to such sensors that employ thermal-mechanical means for rotating the sensor in response to changes in ambient temperature.

2. Description of the Prior Art

Developmental efforts of the device of this invention are based upon the principles of the Faraday effect which was first discovered in 1845. Briefly, when a plane of polarized beam of light passes through certain transparent substances along the lines of a strong magnetic field, the plane of polarization of the emergent light is different from that of the incident light. Under the influence of a magnetic field H the plane of polarization undergoes a rotation $d\theta$ proportional to H', which is the component of H that is parallel to dl, and depends upon the Verdet constant (V) of the magneto-optical material utilized. This can be expressed as $d\theta$ equals VH'dl, wherein "dl" is the length of the path.

Associated with the foregoing is the fact that the Verdet coefficient is dependent upon temperature which reason variations in temperature must be compensated for in order to obtain accurate current information with a current sensor. Although various means have been devised for compensating for temperature variations a simple means to offset the temperature dependence of the material employed in a current sensor is desirable where a moderate degree of accuracy is required.

SUMMARY OF THE INVENTION

It has been found in accordance with this invention that a device for measuring current flowing through an electric conductor may be provided which device comprises a body of magneto-optical material disposed within the magnetic field of a current carrying conductor, and a thermal-mechanical rotator attaching to the Faraday rotator body for rotating the body within the magnetic field lines in response to variations in temperature, polarizing means for directing a beam of polarized light having a predetermined plane of polarization into the body to produce a reflected polarized light beam having a rotated plane of polarization, analyzer means for detecting the rotated plane of polarization and generating an output signal in response thereto, and electronic circuit means responsive to the output signal of the analyzer means for producing an electronic signal proportional to the current independent to the temperature of the conductor.

The advantage of the device of this invention is that it provides an effective means of offsetting the temperature dependence of the material of a current sensor with a reasonable degree of accuracy.

DESCRIPTION OF THE PREFERRED EMBODIMENT

Figure 1:
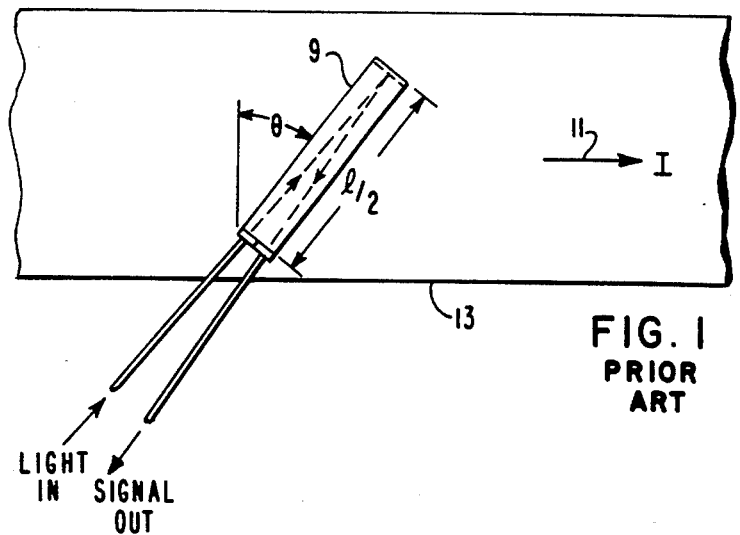
FIG. 1 is a schematic view of a Faraday rotator current sensor of prior art usage.

The operation function of a simple Faraday rotator current sensor 9 (FIG. 1) has an elongated rectangular shape with its longitudinal axis disposed at an angle $\theta$ with respect to the direction of current flow as indicated by an arrow 11 in a conductor 13. The rotational signal for a polarized light passing through the sensor is given by the following equation:

$$S = V g_o I \cos \theta$$

where V is the Verdet coefficient of the sensor material, and is generally a function of temperature; $g_o$ is the geometric form factor representing the magnetic field strength at the sensor location per unit conductor current for the condition of $\theta = 0$; I is the total conductor current, and l is the total active interaction length of the polarized light with the sensor material. The term $\cos \theta$ represents the component of magnetic field strength in the direction of light propagation. Since the optical rotation S is proportional to the Verdet coefficient V which is a function of temperature T, a mechanical device is sought such that $\theta$ responds to the temperature also and in such a manner that $$V(T) \cos \theta(T) \simeq \text{constant}.$$

By this method the rotational signal S becomes a function of the conductor current I only and is insensitive to the temperature T.

Figure 2:
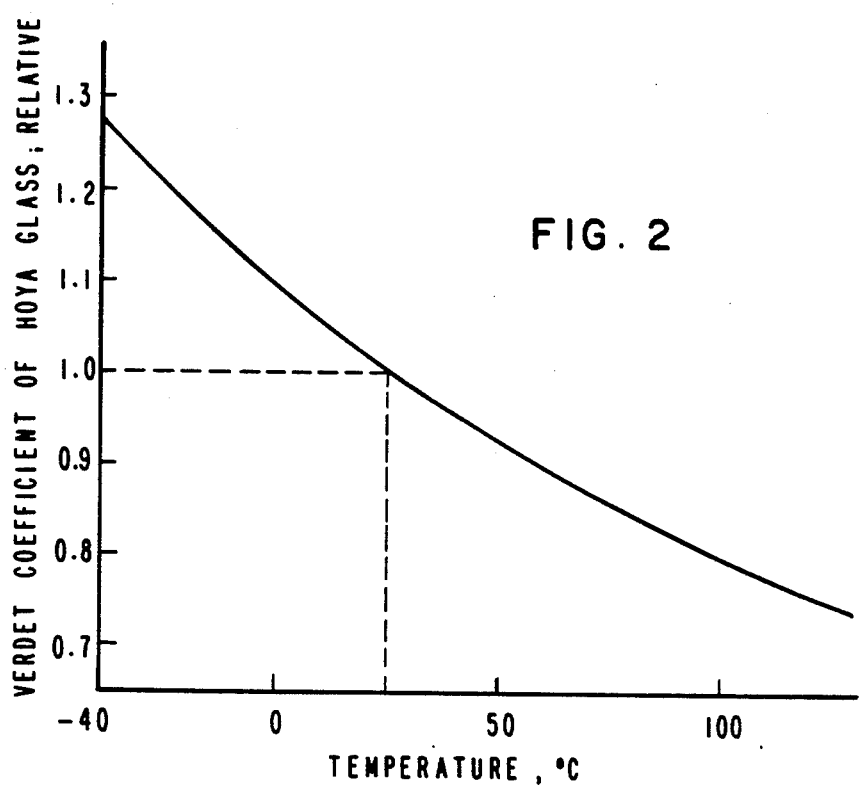
FIG. 2 is a graph showing the relative Verdet coefficient of Hoya FR5 Faraday rotator glass as a function of temperature, where the Verdet coefficient V equals 1 at a temperature of 25° C.

Even though this concept can be applied to almost all materials in a limited temperature range, the example given here and the data collected are for Hoya FR5 glass only. In this specific example $$V(T) \alpha 1/T$$

and its relative value is shown in FIG. 2 where a relative value of 1.0 is assigned for V at room temperature (T=298° K., i.e., 25° C.).

Figure 3:
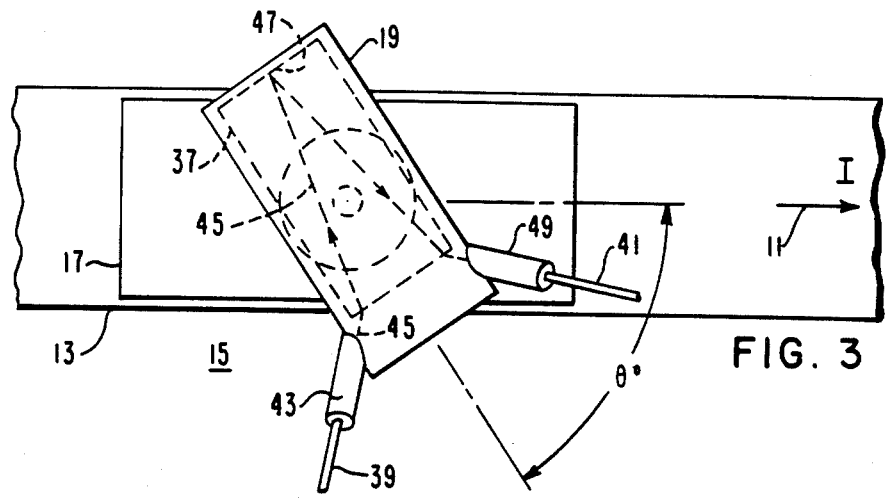
FIG. 3 is a plan, schematic view of a thermal-mechanical rotator attached to the bottom plate of the sensor compartment, the assembly is resting on a conductor.
Figure 4:
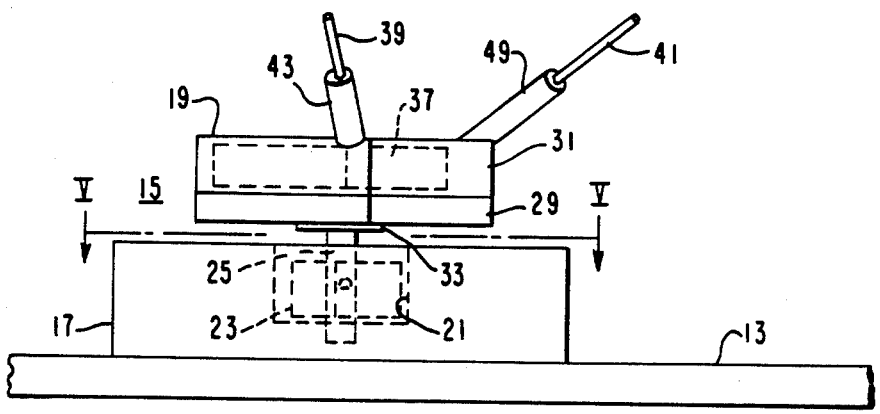
FIG. 4 is a side view of the device shown in FIG. 3.
Figure 5:
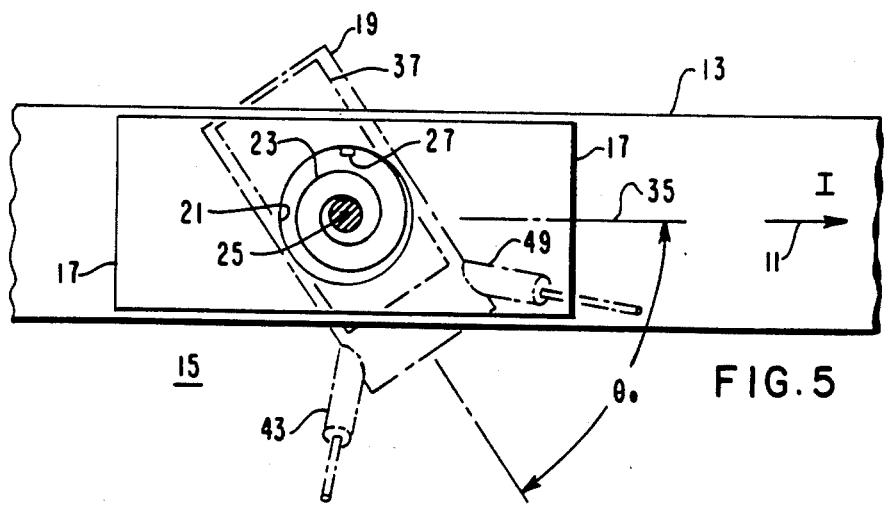
FIG. 5 is a horizontal sectional view taken on the line VII—VII of FIG. 4.

In FIGS. 3, 4, and 5 a temperature compensator is generally indicated at 15 and it comprises a base 17 and a rotatable member 19. The base 17 can be a body of any suitable shape composed of a material having a high coefficient of electrical conductivity such as copper or aluminum for the purpose of shielding the bi-metal coil from an ac field induced eddy-current heating effect. The base includes a compartment 21 in which a thermal-mechanical rotator, such as a bi-metal coil 23 is located. The bi-metallic coil 23 is illustrative of a thermal-mechanical rotator. Any non-metallic material capable of performing the thermal-mechanical function can also be adopted for temperature compensation applications in which event the base 17 may be replaced by a non-metallic and lighter material such as a synthetic resin. The inner end of the metallic coil 23 is secured to a shaft 25 and the outer end is secured in a suitable manner such as by a screw 27 to the wall of the compartment 21.

The rotatable member 19 includes a base 29 (FIG. 4) and a housing 31 which are secured together and rotatably mounted on a flange 33 at the upper end of the shaft 25. Thus when the ambient temperature increases or decreases the bimetallic coil 23 expands or contracts causing the rotatable member to turn clockwise or counterclockwise through an angle $\theta$. With respect to the longitudinal axis 35 of the conductor 13. Accordingly, once the base position of the rotatable member 19 is calibrated with respect to the conductor 13, any changes in the ambient temperature of the conductor are compensated for automatically by the coil 23 to achieve temperature stability in the range of from about $-40°$ C. to 130° C.

The housing 31 contains body 37 of magneto-optical material exhibiting the Faraday affect in a magnetic field of the current carrying conductor 13. Examples of such material include Hoya FR5 glasses and quartz. As shown in FIGS. 3-5 a pair of optical cables 39, 41 are connected to the member 19. The cable 39 extends from a light source (not shown) and is connected to an input polarizer 43. From the polarizer polarized light rays 45 enter and extend through the body 37, are reflected from a mirror surface 47 where they are reflected back to an analyzer 49 from which an optical signal enters the cable 41. For current sensors having Hoya FR5 glass the rotation of the whole sensor assembly includes approximately 30° in the temperature range of interest, i.e., $-40°$ C. to 130° C.

Figure 6:
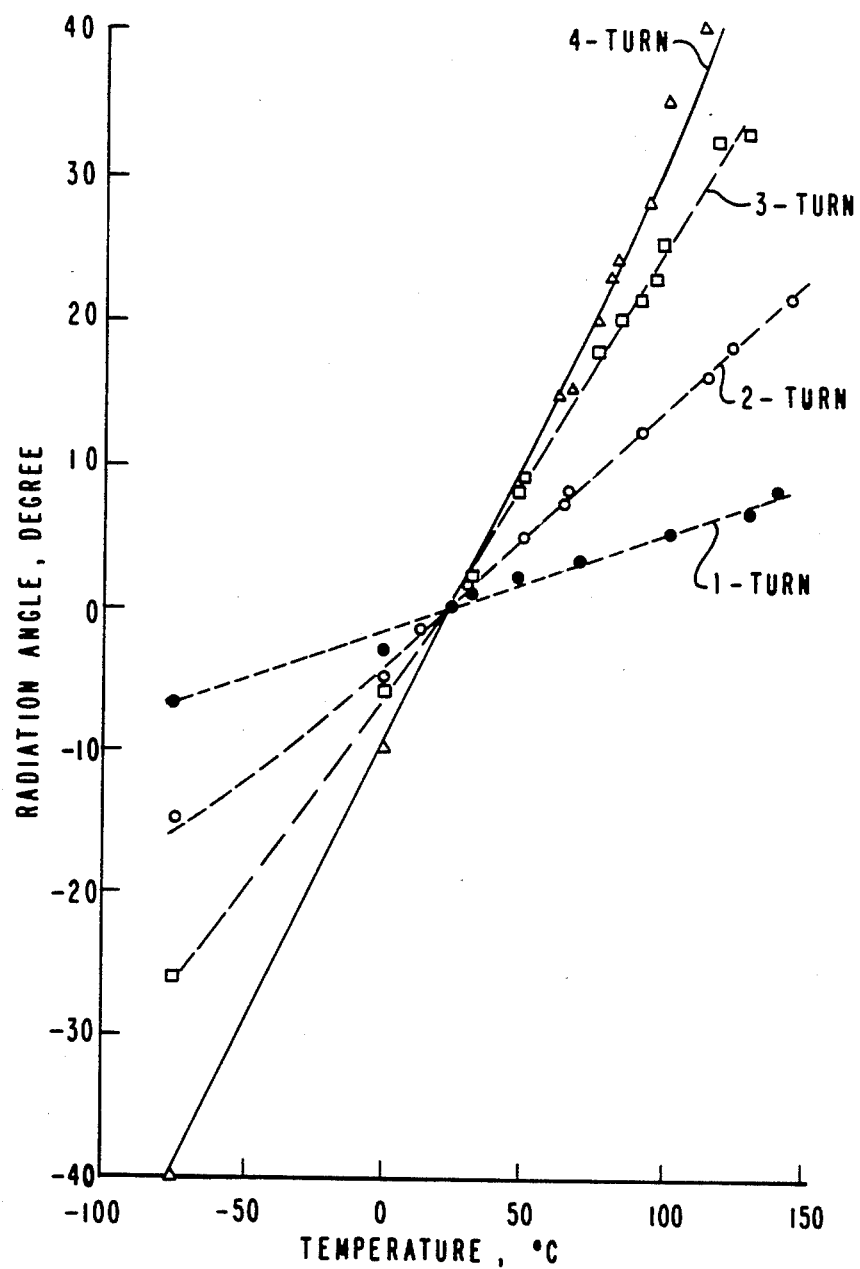
FIG. 6 is a graph showing the angular deflection of a bi-metal coil as a function of temperature taking the number of coil turns as a parameter.

The temperature characteristics of the thermal-mechanical rotator or bimetallic coil 23 are determined experimentally and are shown in FIG. 6. The four curves correspond to four different configurations of the coil. When the coil has four complete turns it exhibits a relatively large thermal sensitivity of approximately 0.4° rotation per degree centigrade. As the number of turns is reduced, the temperature-rotational sensitivity is likewise reduced. By proper trimming of the number of turns one can select a proper thermal characteristic of the bimetal coil such that the product of V(T) Cos $\theta$(T) is near constant in the temperature range of interest, thus rendering a simple yet accurate Faraday rotary current sensor free of temperature affect.

Figure 7:
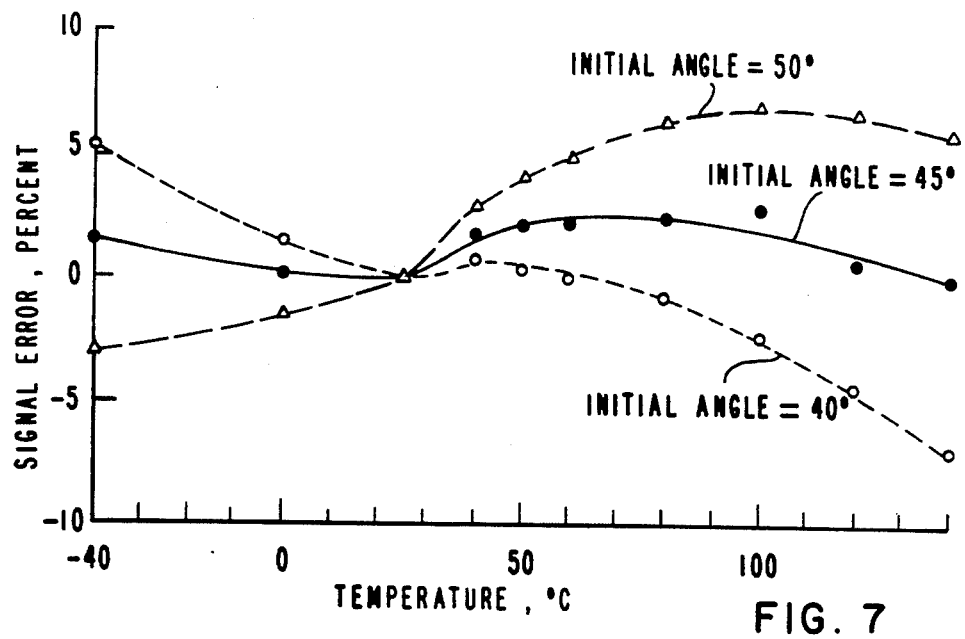
FIG. 7 is a graph showing percent error of sensor signal deviated from room temperature value as a function of sensor temperature using initial angle setting $\theta_0$ as a parameter.

The accuracy of the sensor in the temperature range of $-40°$ C. to 140° C. of interest depends to some degree on the initial angle $\theta_0$ of the sensor set at room temperature (25° C.). This affect is exemplified in FIG. 7 which shows signal error curves as a function of temperature for three different initial angles. For moderate signal accuracy requirements, the present scheme of thermal-mechanical compensation can easily achieve a signal output stability to within $\pm 2\%$.

Figure 8:
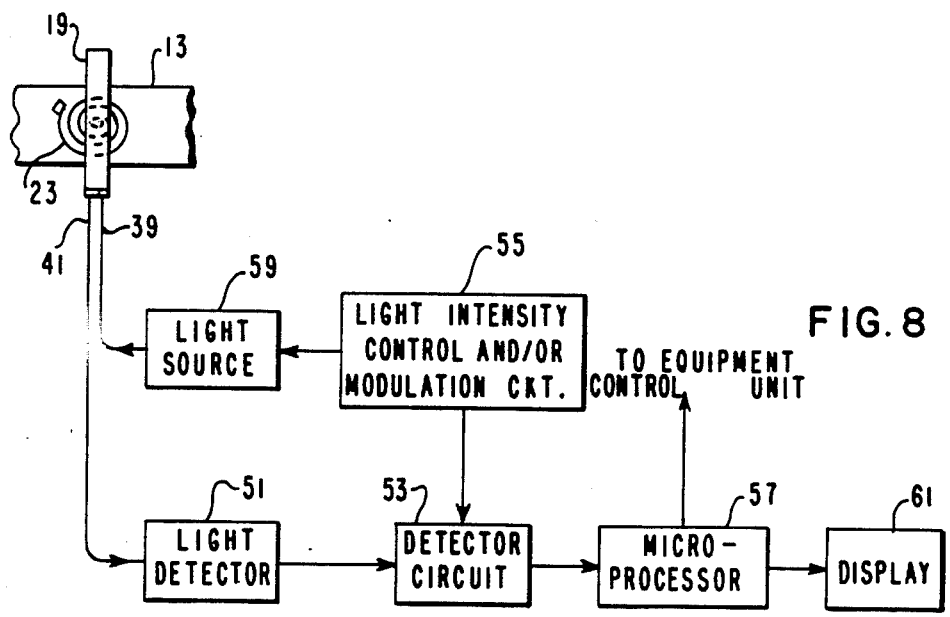
FIG. 8 is a schematic diagram of a signal processor for a current sensor.

A flow diagram of electronics to handle signal processing is shown schematically in FIG. 8, where the first step of signal processing is by a detector 51 from which the signal is transmitted to a detector circuit 53 in conjunction with a signal from a light intensity control and/or modulation circuit 55. A resulting signal from the detector circuit 53 is received by a microprocessor 57 where the signal which is dependent upon the particular modulation frequency of a light source 59 compares and calibrates it and ultimately transmits the resulting signal to a display 61.

In conclusion, a Faraday rotator current sensor is provided which display remarkable temperature stablity due to the employment of a simple thermal-mechanical compensator to the sensor. The structure is simple, compact, and economical and is a viable scheme for sensing ac currents in many applications.

What we claim is:

1. A device for measuring the current flowing through an electric conductor, comprising:
    (a) a body of magnetic-optical material disposed within the magnetic field lines of a current-carrying conductor;
    (b) thermal-mechanical rotator means on the body for rotating the body within the magnetic field lines in response to variations in temperature;
    (c) polarizing means for directing a beam of polarized light having a predetermined plane of polarization into the body to produce a reflected polarized light beam having a rotated plane of polarization; and
    (d) analyzer means for detecting the rotated plane of polarization and generating an output signal in response thereto; and
    (e) electronic circuit means responsive to the output signal of the analyzer means for producing an electronic signal proportional to the current and temperature in the conductor.

2. The device of claim 1 in which the thermal-mechanical rotation means includes a base and a rotatable member rotatably mounted on the base in response to ambient temperature variations.

3. The device of claim 2 in which the body is located within the rotatable member.

4. The device of claim 3 in which the body is comprised of a material selected from the group consisting of Hoya FR5 glasses and quartz.

5. The device of claim 4 in which the body is comprised of Hoya FR5 glass.

6. The device of claim 3 in which the thermal-mechanical rotation means includes a bimetallic coil.

* * * * *